United States Patent
Shin et al.

(10) Patent No.: US 10,636,860 B2
(45) Date of Patent: Apr. 28, 2020

(54) ORGANIC LIGHT EMITTING DISPLAY DEVICE FOR PROTECTING AN ELECTROSTATIC DISCHARGING CIRCUIT

(71) Applicant: LG Display Co., Ltd., Seoul (KR)

(72) Inventors: SangIl Shin, Goyang-si (KR);
SangDuk Jung, Gumi-si (KR);
ChoonHo Park, Paju-si (KR);
KiYoung Sung, Seoul (KR); TaeHyun Min, Seoul (KR); JaeHyun You, Jeonju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/048,757

(22) Filed: Jul. 30, 2018

(65) Prior Publication Data
US 2019/0067409 A1 Feb. 28, 2019

(30) Foreign Application Priority Data
Aug. 31, 2017 (KR) ........................ 10-2017-0110783

(51) Int. Cl.
*H01L 29/08* (2006.01)
*H01L 27/32* (2006.01)
(Continued)

(52) U.S. Cl.
CPC ...... *H01L 27/3276* (2013.01); *H01L 27/0266* (2013.01); *H01L 27/0288* (2013.01);
(Continued)

(58) Field of Classification Search
CPC ............. H01L 27/3276; H01L 27/0266; H01L 27/0288; H01L 27/3258; H01L 51/0097; H01L 51/5253
(Continued)

(56) References Cited

U.S. PATENT DOCUMENTS 9,276,055 B1   3/2016   Son et al.
2014/0306941 A1   10/2014   Kim et al.
(Continued)

FOREIGN PATENT DOCUMENTS

KR   10-2016-0070257 A   6/2016

OTHER PUBLICATIONS

Extended European Search Report dated Jan. 9, 2019, issued in corresponding European Patent Application No. 18187943.8.

*Primary Examiner* — Caleb E Henry
(74) *Attorney, Agent, or Firm* — Morgan, Lewis & Bockius LLP (57) ABSTRACT

Provided is an organic light emitting display device in which a protective layer covers an electrostatic discharging circuit to minimize a damage which may be generated while discharging static electricity. At least one driving element which is connected to a data line and a gate line is disposed on a substrate. The driving element is covered by a planarization layer and is connected to the organic light emitting diode disposed on the planarization layer. The electrostatic discharging circuit is electrically connected to the data line or the gate line and is covered by the protective layer to minimize damages which may be caused in the organic light emitting display device during the process of discharging static electricity through the electrostatic discharging circuit.

12 Claims, 6 Drawing Sheets

(51) Int. Cl.
*H01L 27/02* (2006.01)
*H01L 51/52* (2006.01)
*H01L 51/00* (2006.01)

(52) U.S. Cl.
CPC ...... *H01L 27/3258* (2013.01); *H01L 51/0097* (2013.01); *H01L 51/5253* (2013.01); *H01L 51/5256* (2013.01)

(58) Field of Classification Search
USPC .......................................................... 257/40
See application file for complete search history.

(56) References Cited

U.S. PATENT DOCUMENTS

| | | | |
|---|---|---|---|
| 2015/0243720 A1* | 8/2015 | Kwon | H01L 27/1248 257/40 |
| 2015/0255449 A1* | 9/2015 | Kim | G02F 1/136204 349/40 |
| 2016/0035811 A1* | 2/2016 | Choi | H01L 51/5221 257/72 |
| 2016/0155736 A1* | 6/2016 | Kim | G02F 1/1345 257/43 |
| 2016/0209691 A1* | 7/2016 | Yang | G02F 1/1368 |

* cited by examiner

ORGANIC LIGHT EMITTING DISPLAY DEVICE FOR PROTECTING AN ELECTROSTATIC DISCHARGING CIRCUIT

CROSS-REFERENCE TO RELATED APPLICATIONS

This application claims the priority of Korean Patent Application No. 10-2017-0110783 filed on Aug. 31, 2017, in the Korean Intellectual Property Office, the disclosure of which is incorporated herein by reference.

BACKGROUND

Technical Field

The present disclosure relates to an organic light emitting display device which includes a protective layer for protecting an electrostatic discharging circuit for minimizing damages of the organic light emitting display device due to static electricity, and more particularly, to an organic light emitting display device which protects an electrostatic discharging circuit.

Description of the Related Art

Examples of the display device include a liquid crystal display (LCD), an organic light emitting diode (OLED), an electrophoretic display (EPD), and an electro wetting display.

The display device includes a display panel which displays images through a pixel array in which pixels are independently driven by thin film transistors (TFT) and a gate driving unit and a data driving unit which drive the display panel. Recently, the gate driving unit mainly uses a gate in panel (GIP) technology in which the gate driving unit is formed together with a TFT array of the pixel array to be embedded in a non-display area of the display panel.

Further, in recent years, various forms and functions of the display device are demanded and in order to implement various forms and functions, a substrate formed of a plastic material such as polyimide is used as a flexible substrate.

An organic light emitting display device is mainly used as the display device having various forms and functions. The organic light emitting display device has advantages in that a separate light source is unnecessary, low-power driving is allowed, and various shapes of display area can be disposed on various shapes of substrate.

However, in the organic light emitting display device, since an organic material is used for a light emitting layer, it is disadvantageous in that it is vulnerable to penetration of oxygen and moisture. Thus, in order to compensate the disadvantage, an encapsulation layer which may minimize the penetration of oxygen and moisture is disposed on the organic light emitting diode to protect the organic light emitting layer.

A moisture penetration path may be generated due to various influences by various components included in the display device. As some examples thereof, minute cracks may be generated in the encapsulation layer which protects the organic light emitting layer, due to a discharge phenomenon which may be generated in the electrostatic discharging circuit of the display device. Such minute cracks undesirably provide a path which oxygen and moisture penetrate into the organic light emitting layer. Further, an electrode which connects components disposed at an outer periphery of the display area, such as an electrostatic discharging circuit, may be oxidized or electrically corroded by the flow of current. Thus, the moisture penetration path may be undesirably generated due to the oxidation or electrical corrosion.

SUMMARY

A thin film encapsulation technique which alternately laminates inorganic layers and organic layers is used to seal the organic light emitting diode. As an inorganic layer for the thin film encapsulation technique, an oxide layer such as aluminum oxide (AlOx) which may secure excellent barrier property even with a small thickness is mainly used. Specifically, since the smaller the thickness of the thin film encapsulation, the better the flexibility of the organic light emitting display device, an oxide layer may be advantageously used for an inorganic layer of the thin film encapsulation to implement a flexible organic light emitting display device. However, as described above, during the process of discharging static electricity through the electrostatic discharging circuit, the encapsulation layer disposed above the electrostatic discharging circuit may be minutely cracked due to excessively concentrated current. Thus, a moisture penetration path may be generated due to minute cracks. Further, the moisture penetration path may be generated due to oxidation or electrical corrosion which may be generated in an electrode which configures the electrostatic discharging circuit.

Accordingly, embodiments of the present disclosure are directed to a organic light emitting display device that substantially obviates one or more of the problems due to limitations and disadvantages of the related art.

Accordingly, an object of the present disclosure is to provide an organic light emitting display device with an improved reliability by minimizing a moisture penetration path which may be generated in the electrostatic discharging circuit.

Another object of the present disclosure is to provide an organic light emitting display device which may minimize damages of an encapsulation layer due to a discharging activity which may be generated in the electrostatic discharging circuit.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting display device comprises a data line and a gate line disposed on a substrate and at least one driving element which operates to transmit current and signals to an organic light emitting diode in response to signals transmitted from the data line and the gate line. The organic light emitting diode is disposed on a planarization layer and the planarization layer is disposed to cover the driving element, the data line, and the gate line so as to dispose the organic light emitting diode. Further, in order to minimize the damages of the display device due to static electricity, an electrostatic discharging circuit connected to the data line and the gate line is disposed. The electrostatic discharging circuit is covered by a protective layer to minimize influence due to the discharging of static electricity and thus improve the lifespan reliability of the display device.

According to the exemplary embodiment of the present disclosure, a protective layer which covers an electrostatic discharging circuit is equipped to improve lifespan reliability for static electricity of an organic light emitting display device. Further, the influence of the static electricity is minimized by using the protective layer to improve a display quality of the organic light emitting display device.

Objects of the present disclosure are not limited to the above-mentioned objects, and other objects, which are not mentioned above, can be clearly understood by those skilled in the art from the following descriptions.

The objects to be achieved by the present disclosure, the means for achieving the objects, and effects of the present disclosure described above do not specify essential features of the claims, and, thus, the scope of the claims is not limited to the disclosure of the present disclosure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that a person of ordinary skilled in the art can fully understand the disclosures of the present disclosure and the scope of the present disclosure. Thus, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When the relation of a time sequential order is described using the terms such as "after", "continuously to", "next to", and "before", the order may not be continuous unless the terms are used with the term "immediately" or "directly".

When the signal flowing relation is described, for example, when it is described that a signal is transmitted from a node A to a node B, the signal may be transmitted from the node A to the node B via another node unless the terms are used with the term "immediately" or "directly".

Although the terms "first", "second", and the like are used for describing various components, these components are not confined by these terms. These terms are merely used for distinguishing one component from the other components. Thus, a first component to be mentioned below may be a second component in a technical concept of the present disclosure.

The features of various embodiments of the present disclosure can be partially or entirely bonded to or combined with each other and can be interlocked and operated in technically various ways, and the embodiments can be carried out independently of or in association with each other.

Hereinafter, various configurations and exemplary embodiments of an organic light emitting display including an electrostatic discharging circuit according to an exemplary embodiment of the present disclosure will be described with reference to the accompanying drawings.

Figure 1:
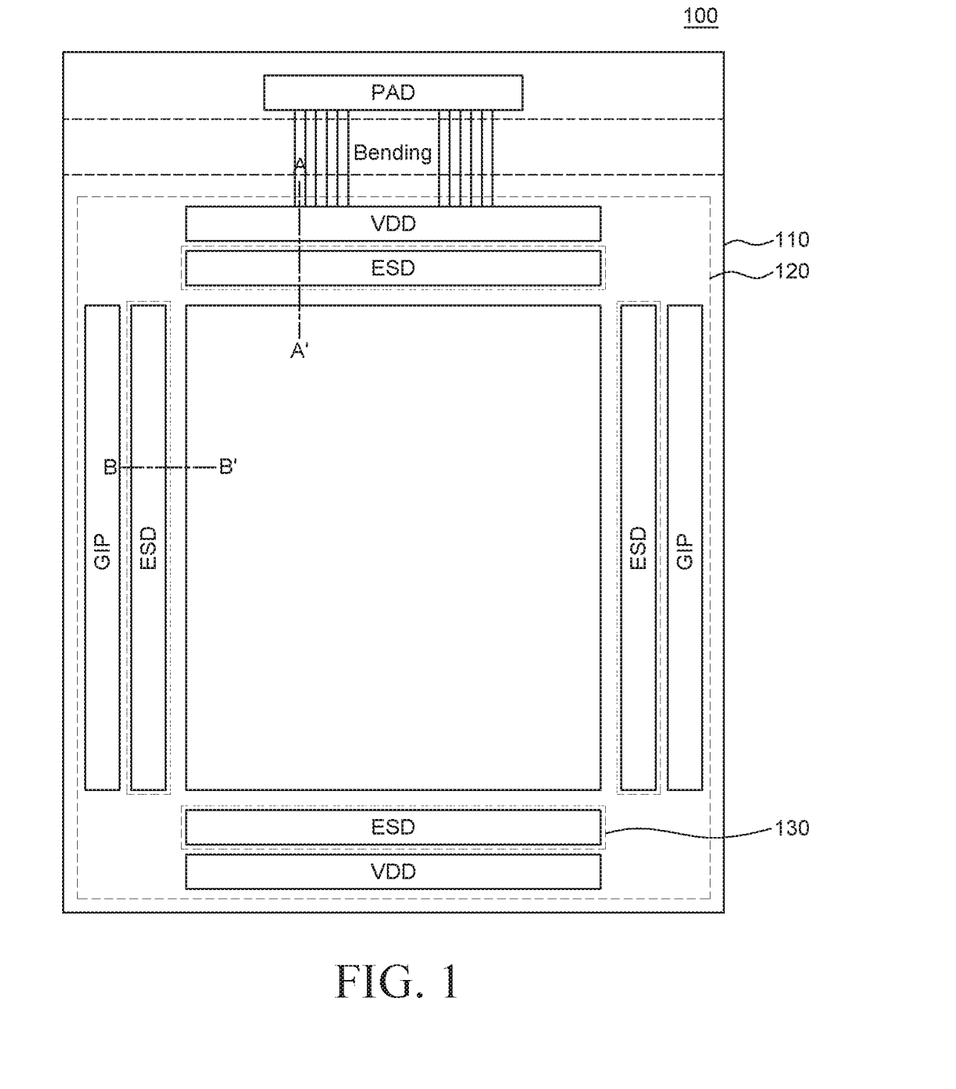
FIG. 1 is a view schematically illustrating an organic light emitting display device including an electrostatic discharging circuit according to an exemplary embodiment of the present disclosure.

FIG. 1 is a view schematically illustrating an organic light emitting display device including an electrostatic discharging circuit according to an exemplary embodiment of the present disclosure.

Referring to FIG. 1, even though it is simply illustrated, an organic light emitting display device 100 includes an active area on a substrate 110 which is a display area and includes a driving voltage line VDD which is connected to a pad unit PAD, a gate driving unit GIP, and an electrostatic discharging circuit ESD for minimizing damages due to static electricity which may be generated in the organic light emitting display device 100. Further, the organic light emitting display device 100 includes a bending area between the pad unit PAD and the active area so that the pad unit PAD is folded to a rear surface of the organic light emitting display device 100 to minimize the non-display area such as a pad unit PAD, but is not limited thereto.

The electrostatic discharging circuit ESD may be configured to be connected to the gate driving unit GIP or the driving voltage line VDD and may be disposed to enclose the active area. In FIG. 1, as an example, it is illustrated that the organic light emitting display device 100 has a rectangular shape and the electrostatic discharging circuits ESD are disposed on the upper, lower, left, and right sides, but the shape of the organic light emitting display is not limited thereto. The organic light emitting display device 100 may be a circular display device or various types of display device such as an electric signboard of a vehicle.

Even though it is not illustrated in the active area, there are an organic light emitting diode including an organic light emitting layer and at least one driving element for controlling the driving of the organic light emitting diode and the driving element is disposed to be connected to the driving voltage line VDD and the gate driving unit GIP.

As described above, in the organic light emitting diode and the organic light emitting layer in the active area, a defect such as a dark spot may be generated due to moisture and oxygen. Thus, an encapsulation layer 120 is disposed to cover the active area to protect the organic light emitting diode from penetration of oxygen and moisture.

The encapsulation layer 120 is disposed to minimize the permeation of oxygen and moisture as described above and is disposed to also cover the electrostatic discharging circuit ESD, the gate driving unit GIP, and the driving voltage line VDD. The encapsulation layer 120 may be an encapsulation layer formed of an inorganic material and may have a multi-layered structure formed of two or more layers including an organic material.

While the electrostatic discharging circuit ESD discharges static electricity accumulated in the organic light emitting display device 100, the encapsulation layer 120 formed of the inorganic material may be damaged. Thus, the protective layer 130 covers the electrostatic discharging circuit ESD to minimize damages to be generated during the process of discharging static electricity. Alternatively, the defect due to electrical corrosion of a wiring electrode caused by abnormal voltage and current which may be generated in the electrostatic discharging circuit ESD may be minimized.

Figure 2:
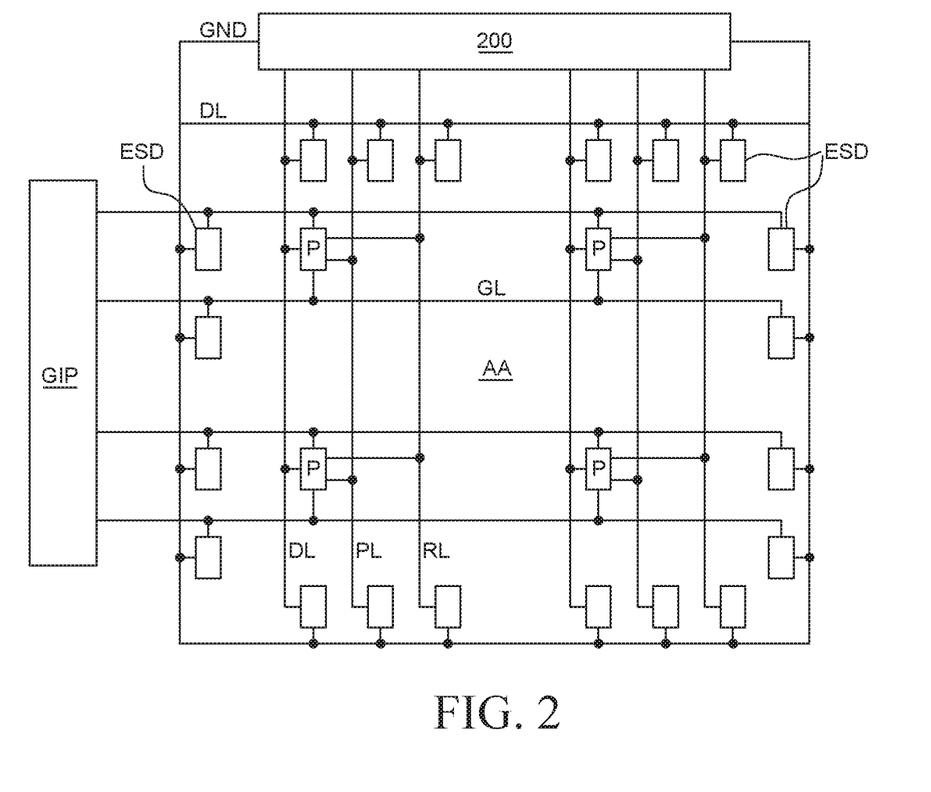
FIG. 2 is a view schematically illustrating an electrical connection relationship of an organic light emitting display device including an electrostatic discharging circuit according to an exemplary embodiment of the present disclosure.

FIG. 2 is a view schematically illustrating an electrical connection relationship of an organic light emitting display device including an electrostatic discharging circuit according to an exemplary embodiment of the present disclosure.

Referring to FIG. 2, the organic light emitting display device 100 includes a gate driving unit GIP and a data driving unit 200 which are panel driving units.

The data driving unit 200 converts image data supplied from a timing controller (not illustrated) into an analog data signal using gamma voltages and supplies the analog data signal to data lines DL. The data driving unit 200 supplies a reference voltage to a reference line RL. The data driving unit 200 may supply a high potential power supply voltage EVDD, a low potential power supply voltage EVSS, and a ground voltage GND supplied from a power supply unit (not illustrated) to the display panel 100.

The gate driving unit GIP drives a plurality of gate lines GL in accordance with gate control signals from the timing controller (not illustrated). The gate driving unit GIP supplies a scan pulse of a gate-on voltage to each gate line GL during a scan period and supplies a gate-off voltage during the remaining period. The gate driving unit GIP is on a thin film transistor array substrate together with thin film transistors which configure the pixels P of the pixel array in an inactive area to be embedded. As switching elements which configure the gate driving unit GIP, a poly-TFT or an oxide TFT having a coplanar structure in which source and drain electrodes do not overlap the gate electrode may be used to reduce a parasitic capacitance.

The organic light emitting display device 100 displays images through a matrix type pixel array. Each pixel P of the pixel array is independently driven by the TFT. As the TFT, an amorphous silicon (a-Si) TFT, a poly silicon (poly-Si) TFT, an oxide TFT, or an organic TFT may be used.

Figure 3:
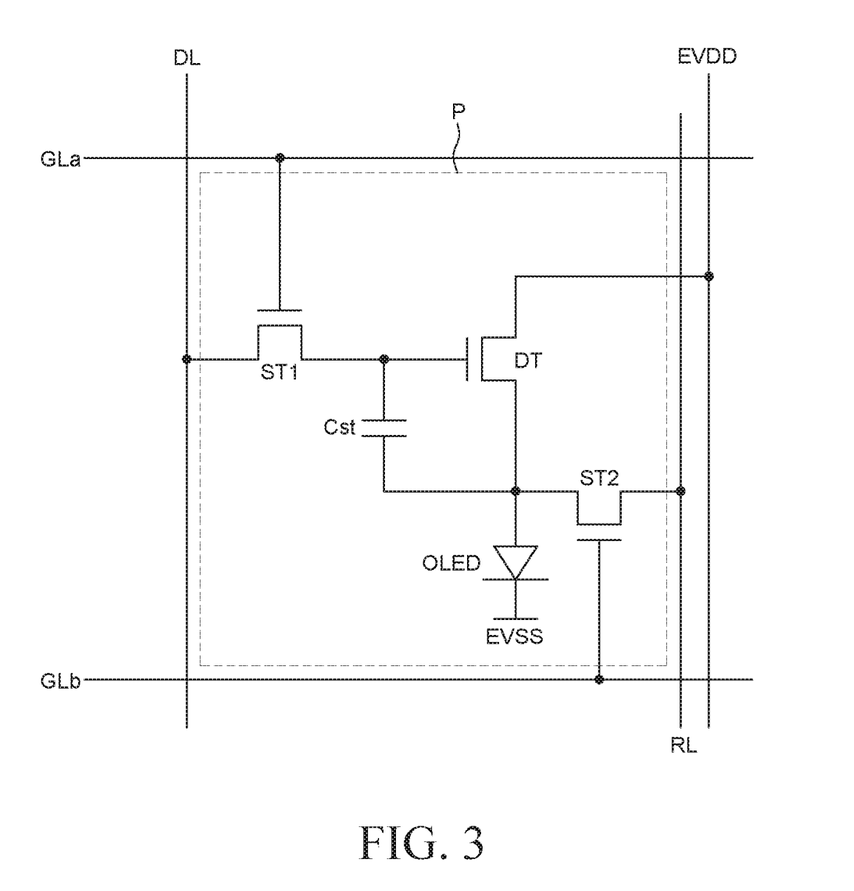
FIG. 3 is an equivalent circuit diagram illustrating a configuration of one pixel illustrated in FIG. 2.

FIG. 3 is an equivalent circuit diagram illustrating a configuration of one pixel illustrated in FIG. 2.

Each pixel includes an OLED element connected between the high potential power supply (EVDD) line and a low potential power supply (EVSS) line and a pixel circuit which includes first and second switching TFTs ST1 and ST2 and a driving TFT (DT) for independently driving the OLED element and a storage capacitor Cst. However, the pixel circuit has various configurations so that it is not limited to the structure of FIG. 3.

The OLED element includes an anode connected to the driving TFT (DT), a cathode connected to the low potential power supply EVSS, and a light emitting layer between the anode and the cathode to generate light which is proportional to an amount of current supplied from the driving TFT (DT).

The first switching TFT (ST1) is driven by a gate signal of one gate line GLa to supply the data voltage from the data line DL to a gate node of the driving TFT (DT) and the second switching TFT (ST2) is driven by a gate signal of another gate line GLb to supply a reference voltage from the reference line RL to a source node of the driving TFT (DT). The second switching TFT (ST2) is used as a path which outputs the current from the driving TFT (DT) to the reference line RL in a sensing mode.

The storage capacitor Cst connected between the gate electrode and the source electrode of the driving TFT (DT) charges a different voltage between a data voltage supplied to the gate electrode of the driving TFT (DT) through the first switching TFT (ST1) and a reference voltage supplied to the source electrode of the driving TFT (DT) through the second switching TFT (ST2) and supplies the charged voltage as a driving voltage of the driving TFT (DT) during a period when the first and second switching TFTs ST1 and ST2 are turned off.

The driving TFT (DT) controls the current supplied from the high potential power supply EVDD in accordance with a driving voltage supplied from the storage capacitor Cst to supply the current proportional to the driving voltage to the OLED element. Thus, the OLED element emits light.

The electrostatic discharging circuit ESD is connected to each of the wiring lines including a gate line GL, a data line DL, a reference line RL, and a power line PL. When the static electricity flows through the wiring lines, the electrostatic discharging circuit ESD is turned on to discharge the static electricity to the ground line to block the static electricity.

Figure 4:
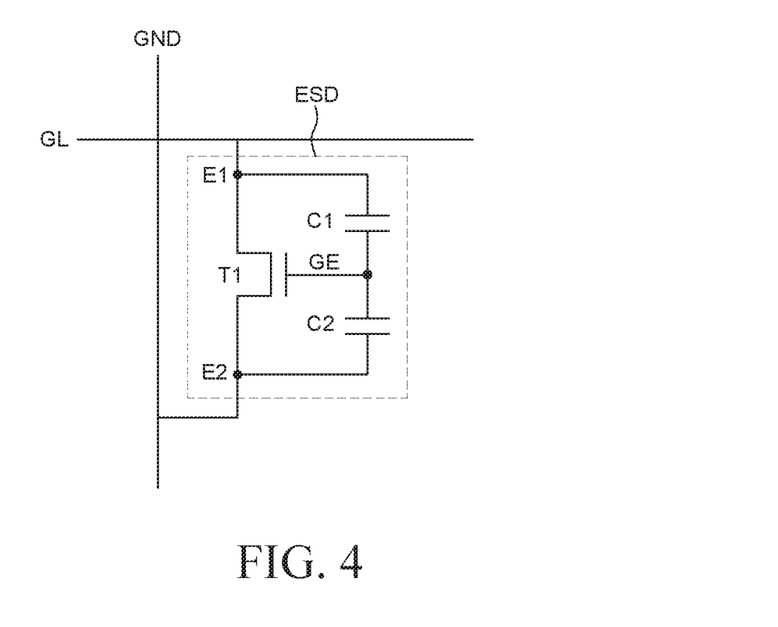
FIG. 4 is an equivalent circuit diagram illustrating a configuration of an electrostatic discharging circuit illustrated in FIG. 2.

FIG. 4 is an equivalent circuit diagram illustrating a configuration of an electrostatic discharging circuit illustrated in FIG. 2.

Referring to FIG. 4, the electrostatic discharging circuit ESD connected between each gate line GL and the ground line GND includes a thin film transistor T1, a first capacitor C1 between a gate electrode GE of the thin film transistor T1 and a first electrode E1 and a second capacitor C2 between the gate electrode GE and a second electrode E2. One of the first and second electrodes E1 and E2 is a source electrode and the other one is a drain electrode.

When a normal scan output is supplied to the gate line GL, the scan output is not supplied to the gate electrode GE which is in a floating state by the first and second capacitors C1 and C2 so that the thin film transistor T1 is maintained to be turned off.

When an abnormal voltage such as static electricity is applied to the gate line GL, a voltage is generated in the gate electrode GE by the first capacitor C1 and half of a voltage flowing through the gate line GL is supplied to the gate electrode GE by the first and second capacitors C1 and C2. Thus, the thin film transistor T1 is turned on to discharge the static electricity flowing into the gate line GL to the ground line GND.

When the normal scan output is supplied to the gate line GL, in order to minimize a leakage current flowing through the electrostatic discharging circuit ESD, a channel width of the thin film transistor T1 is smaller than a channel length to increase the resistance of the channel.

Figure 5:
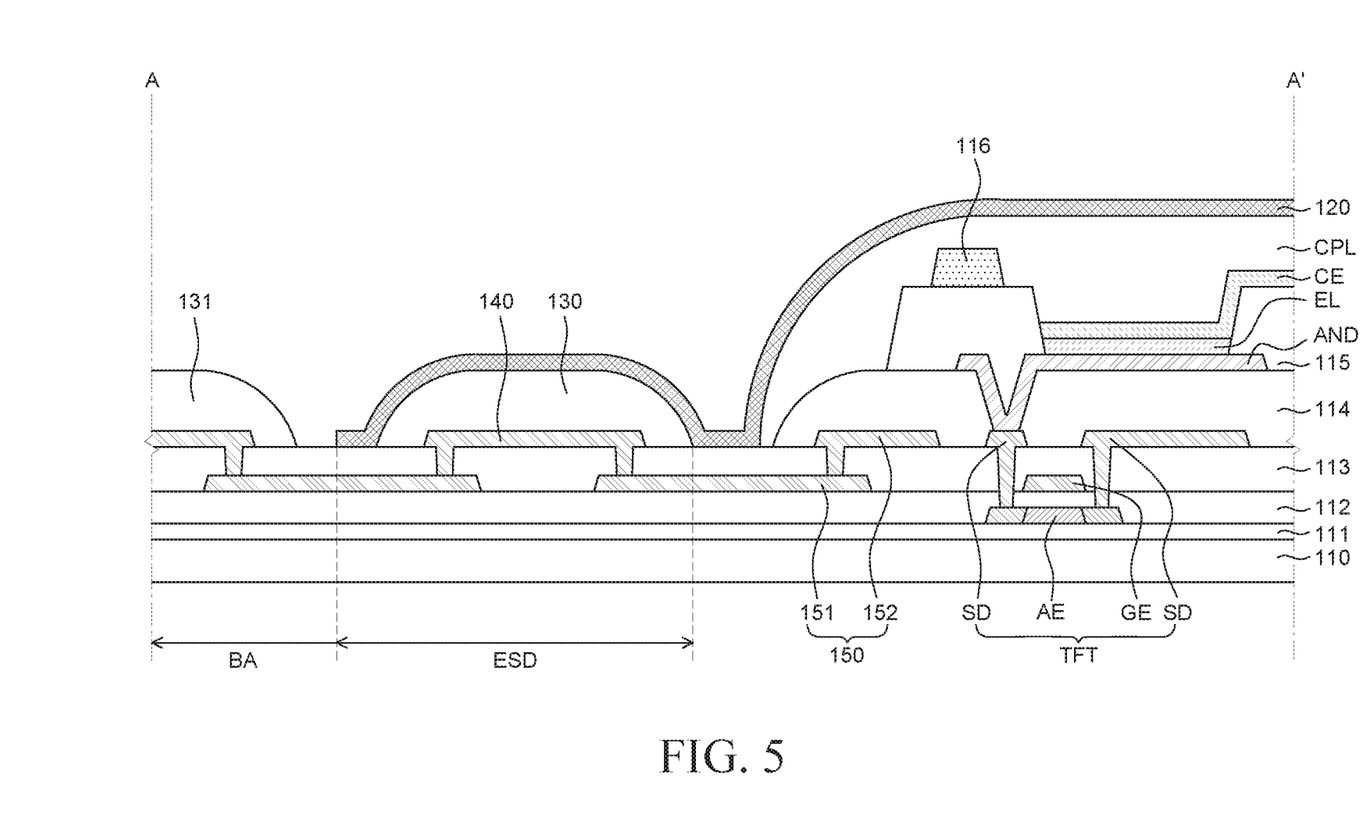
FIG. 5 is a schematic cross-sectional view taken along the line A-A' of FIG. 1 for explaining a protective layer according to an exemplary embodiment of the present disclosure.
Figure 6:
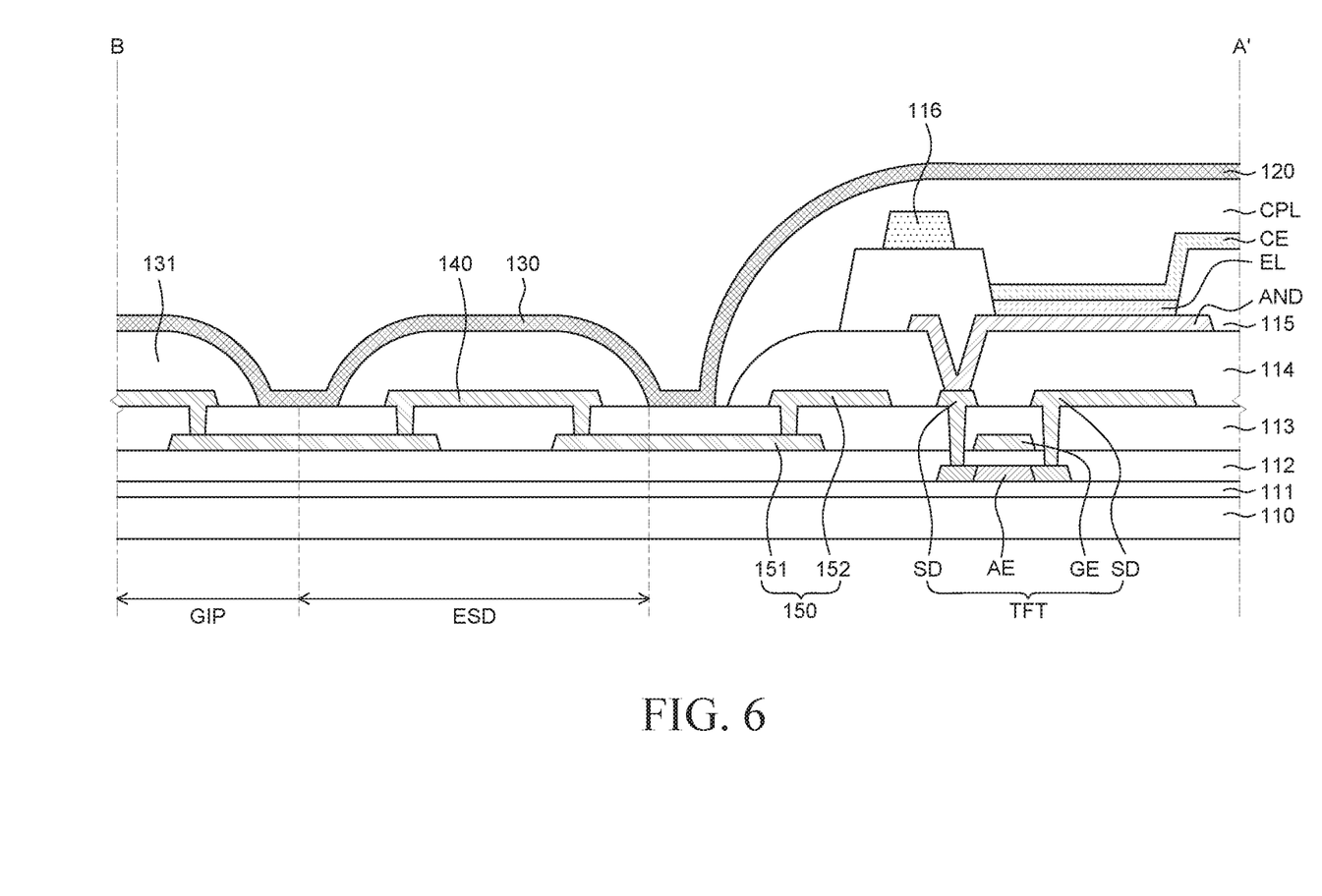
FIG. 6 is a schematic cross-sectional view taken along the line B-B' of FIG. 1 for explaining a protective layer according to an exemplary embodiment of the present disclosure.

FIG. 5 is a schematic cross-sectional view taken along the line A-A' of FIG. 1 for explaining a protective layer according to an exemplary embodiment of the present disclosure and FIG. 6 is a schematic cross-sectional view taken along the line B-B' of FIG. 1 for explaining a protective layer according to an exemplary embodiment of the present disclosure.

A configuration of an organic light emitting display device including an electrostatic discharging circuit ESD covered by a protective layer 130 will be described with reference to FIGS. 5 and 6 and the previous drawings are also referenced.

The organic light emitting display device 100 includes a driving element TFT disposed on a substrate 110, an organic light emitting layer EL, a plurality of wiring electrodes 150, 151, and 152 connected to the driving element TFT, an electrostatic discharging circuit ESD electrically connected to the wiring electrodes 150, 151, and 152, and a gate driving unit GIP.

In the substrate 110, an active area is defined and even though it is simply illustrated, a plurality of organic light emitting diodes is disposed to configure a plurality of pixels. Further, the substrate 110 includes a plurality of driving elements TFTs to supply a signal and current for driving the plurality of pixels to the pixels. For example, a switching thin film transistor, a driving element TFT connected to the switching thin film transistor, and an organic light emitting diode connected to the driving element TFT are disposed on the substrate 110.

The driving elements TFTs such as the switching thin film transistor and the driving element are disposed to be connected to the gate line GL and the data line DL disposed on the substrate 110. The switching thin film transistor serves to select a pixel and is disposed in a portion where the gate line GL and the data line DL intersect each other. The switching thin film transistor includes a gate electrode GE, a semiconductor layer, a source electrode, and a drain electrode.

The driving element TFT serves to drive an anode electrode AND of a pixel selected by the switching thin film transistor. The driving element TFT includes a gate electrode GE connected to a drain electrode of the switching thin film transistor, an active layer AE, a source electrode SD connected to a driving current wiring line, and a drain electrode SD. The drain electrode SD of the driving element TFT is connected to the anode electrode AND which is a pixel electrode of the organic light emitting diode.

The above-described driving element TFT is disposed on a buffer layer 111 on the substrate 110. The buffer layer 111 minimizes penetration of moisture or impurities through the substrate 110 and planarizes an upper portion of the substrate 110. However, the buffer layer 111 is not an essential component. Whether to form the buffer layer 111 is determined based on a type of the substrate 110 or a type of the driving element TFT.

The driving element TFT is on the buffer layer 111 and supplies signals and current to the organic light emitting diode. The driving element TFT includes an active layer AE, a gate electrode GE, a source electrode SD, and a drain electrode SD. Specifically, the active layer AE is on the buffer layer 111 and a gate insulating layer 112 is on the active layer AE to insulate the active layer AE and the gate electrode GE from each other. Further, the gate electrode GE is on the gate insulating layer 112 to overlap the active layer AE and an interlayer insulating layer 113 is on the gate electrode GE and the gate insulating layer 112. The source electrode SD and the drain electrode SD are on the interlayer insulating layer 113. The source electrode SD and the drain electrode SD are electrically connected to the active layer AE.

The active layer AE may be formed of amorphous silicon (a-Si), polycrystalline silicon (poly-Si), an oxide semiconductor, or an organic semiconductor. When the active layer 132 is formed of an oxide semiconductor, the active layer 132 may be formed of ITO, IZO, indium gallium zinc oxide (IGZO), or indium tin zinc oxide (ITZO), but is not limited thereto. When the active layer 132 is formed of IGZO, a ratio of In:Ga:Zn may be 1:2:1. In this case, a Ga rich layer which reduces PBTS may be formed on an upper surface of the IGZO layer in the active layer AE.

In FIGS. 5 and 6, for the convenience of description, among various thin film transistors which may be included in the organic light emitting display device 100, only a driving element TFT connected to the anode AND of the organic light emitting diode is illustrated. However, the organic light emitting display device 100 may further include a switching thin film transistor or a capacitor for driving the organic light emitting diode. Further, in the specification, even though it is described that the driving element TFT has a coplanar structure, an inverted staggered thin film transistor may also be used. Further, even though a structure in which the anode AND of the organic light emitting diode is connected to the drain electrode SD of the driving element TFT is illustrated, the anode AND of the organic light emitting diode may be connected to the source electrode SD of the driving element TFT depending on a design.

A planarization layer 114 is disposed on the driving element TFT. The planarization layer 114 is a layer which planarizes an upper portion of the substrate 110 and is formed of an organic insulating material to cover an upper step of the substrate 110. The planarization layer 114 may be configured by one layer or may have a double layered structure formed of at least two organic insulating materials. Further, the planarization layer 114 includes a contact hole to be electrically connected to the anode AND of the organic light emitting diode.

The organic light emitting diode is disposed on the planarization layer 114 and includes an anode AND, an organic layer EL, and a cathode CE. Even though only one organic light emitting diode is illustrated in FIGS. 5 and 6, a plurality of organic light emitting diodes may be disposed so as to correspond to a plurality of pixel areas of the light emitting display device 100.

The anode AND is an electrode which supplies holes to the organic layer EL and may be configured by a transparent conductive material having a high work function. The transparent conductive material may include ITO, IZO, or ITZO, but is not limited thereto. As illustrated in the drawing, when the organic light emitting display device 100 is driven in a top emission manner, the anode AND may further include a reflector or may include a material having higher reflectance. Here, the anode AND may also be referred to as a pixel electrode.

The cathode CE is an electrode which supplies electrons to the organic layer EL and may be configured by a metal having a relatively low work function, for example, silver, titanium (Ti), aluminum, molybdenum (Mo) or an alloy (Ag:Mg) of silver and magnesium. Here, the cathode CE may also be referred to as a common electrode. When the cathode CE is configured by an alloy of silver and magnesium, a content of silver is higher than a content of magnesium to lower resistance of the cathode CE. In this case, in order to prevent silver from being oxidized and lowering the resistance, a ytterbium (Yb) layer may be disposed above, below, or above and below the Ag:Mg layer.

The organic layer EL is disposed between the anode AND and the cathode CE. The organic layer EL includes an organic light emitting layer. The organic light emitting layer has a patterned emission layer structure. In this case, light emitting layers which emits light of different colors are separately formed for every pixel. For example, a red organic light emitting layer emitting red light, a green organic light emitting layer emitting green light, and a blue organic light emitting layer emitting blue light may be separately formed in a red sub pixel, a green sub pixel, and a blue sub pixel, respectively. In this case, the red sub pixel, the green sub pixel, and the blue sub pixel may configure one pixel. On each of the red organic light emitting layer, the green organic light emitting layer, and the blue organic light emitting layer, holes and electrons supplied through the anode AND and the cathode CE are coupled to each other to emit light. Each of the organic light emitting layers may be deposited as a pattern using a mask which is open for every pixel, for example, a fine metal mask (FMM), but is not limited thereto and the organic light emitting layer may be commonly formed in all the sub pixels on the substrate 110. In this case, the organic light emitting layer may be formed of a material emitting white light and a color filter may be disposed to correspond to an area where the organic light emitting layer emits light.

The organic layers may further include organic layers, such as an injecting layer or a transporting layer, for improving a light emission efficiency of the organic light emitting diode. At least some of organic layers may have a common structure to be commonly disposed for a plurality of sub pixels, in order to achieve an advantage during a manufacturing process.

Here, the organic layer having the common structure may be formed using a common mask in which all sub pixels are opened. The layer having the common structure may be laminated with the same structure in all the sub pixels without having a pattern for every sub pixel. That is, the organic layer having the common structure is disposed to be connected or extend to an adjacent sub pixel from one sub pixel without having a disconnected portion and is shared by a plurality of sub pixels.

For example, in addition to the organic light emitting layer, a hole injection layer or a hole transport layer may further disposed between the anode AND and the cathode CE for smoothly moving the holes. The hole injection layer or the hole transport layer may have a common structure to be commonly disposed in the plurality of sub pixels. In several exemplary embodiments, the hole transport layer may be configured by a p-type hole transport layer on which a p-type dopant is doped.

A bank layer 115 is disposed to define sub pixels and exposes a part of a top surface of the anode AND. Specifically, the bank layer 115 may be disposed to cover an edge of the anode AND. The bank layer 115 is formed of an insulating material to insulate anodes of the adjacent sub pixels from each other. According to several exemplary embodiments, the bank layer 115 may be configured of a black bank having a high optical absorbance to prevent color mixture between adjacent sub pixels.

A spacer 116 may be disposed on the bank layer 115. The spacer 116 is used to support a load of a metal mask such as FMM during a process of disposing the above-described organic light emitting layer and may be formed of the same material as the bank layer 115.

In the meantime, a capping layer CPL which covers the above-described organic light emitting diode may be disposed. The capping layer CPL may include a particulate absorbent or particles for photo-extraction and may be disposed to cover the organic light emitting diode.

An encapsulation layer 120 is disposed on the capping layer CPL to minimize penetration of moisture and oxygen. The encapsulation layer 120 is disposed to cover the entire active area and is disposed to cover the electrostatic discharging circuit ESD, the gate driving unit GIP, and the wiring electrodes 150, 151, and 152.

In the substrate 110 which configures the organic light emitting display device 100, a bending area BA may be defined. In the bending area, the wiring electrodes 150, 151, and 152 are disposed to form an electrical connection relationship with the pad unit PAD. The wiring electrodes 150, 151, and 152 open in the bending area BA may be covered by a wiring electrode protecting layer 131 to prevent oxidation thereof.

The wiring electrodes 150, 151, and 152 are connected to the above-described driving element TFT and is disposed using an electrode such as the source electrode SD or the gate electrode GE. Further, the wiring electrodes 150, 151, and 152 are connected to the electrostatic discharging circuit ESD and the electrostatic discharging circuit ESD may be configured by the same material as the electrode and the semiconductor which form the driving element TFT.

The electrostatic discharging circuit ESD is covered by the encapsulation layer 120 and the protective layer 130 described above. The protective layer 130 may be disposed with the same material as the planarization layer 114 and may be an organic layer formed of an organic material and may be at least one multilayered structure.

While the electrostatic discharging circuit ESD discharges static electricity accumulated in the organic light emitting display device 100, the encapsulation layer 120 may be physically damaged. In order to minimize the physical damage, the electrostatic discharging circuit ESD is covered by the above-described protective layer 130.

The electrostatic discharging circuit ESD may be configured by the same material as the above-described source electrode SD or gate electrode GE. However, during the process of discharging static electricity, electrical corrosion may be caused. The by-products due to the electrical corrosion are absorbed by the protective layer 130 so that the spreading of the by-products to an area where the driving element TFT and the organic light emitting diode are provided may be minimized.

Further, as described above, minute crack due to a physical damage which may be caused in another component during the process of discharging static electricity may be minimized by the electrostatic discharging circuit ESD covered by the protective layer 130, so that a moisture penetration path generated due to the minute crack may be minimized.

The substrate 110 may include a bending area BA. The wiring electrode 150 is disposed in the bending area BA to be connected to the pad unit PAD and the electrostatic discharging circuit ESD. The encapsulation layer 120 on the wiring electrode 150 disposed in the bending area BA is open to prevent the crack from being generated on the encapsulation layer 120 while the substrate 110 is bent. However, the wiring electrode protecting layer 131 is disposed on the wiring electrode 150 disposed in the bending area BA to distribute corrosion of the wiring electrode 150 due to the electrical corrosion and stress when the substrate 110 is bent to prevent the crack on the wiring electrode 150.

The wiring electrode protecting layer 131 may be formed of an organic insulating material and may be formed of the same material as the planarization layer 114 and the protective layer 130. However, the wiring electrode protecting layer 131 is disposed to be isolated from the protective layer 130 and the planarization layer 114 so that even though a moisture penetration path is generated, the spreading of the moisture penetration path may be prevented.

The exemplary embodiments of the present disclosure can also be described as follows:

According to an aspect of the present disclosure, an organic light emitting display device includes at least one driving element which is connected to a data line and a gate line on a substrate, a planarization layer which covers the driving element; an organic light emitting diode which is disposed on the planarization layer and is connected to the driving element; and an electrostatic discharging circuit which is connected to the data line or the gate line, in which the electrostatic discharging circuit is covered by a protective layer.

The planarization layer and the protective layer may include at least one organic layer.

The organic layers included in the planarization layer and the protective layer may be isolated from each other.

The substrate may be a flexible substrate in which a bending area is defined.

The organic light emitting display device may further include an encapsulation layer which covers the organic light emitting diode and the protective layer and in the bending area, the encapsulation layer may be open.

The organic light emitting display device may further include a wiring electrode in the bending area and the wiring electrode may be the same material as an electrode selected from electrodes which configure the driving element.

The organic light emitting display device may further include a wiring electrode protecting layer which covers the wiring electrode.

The wiring electrode protecting layer and the protective layer may be isolated from each other.

The wiring electrode protecting layer may include at least one organic layer.

The wiring electrode may be connected to the electrostatic discharging circuit.

It will be apparent to those skilled in the art that various modifications and variations can be made in the organic light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
   at least one driving element which is connected to a data line and a gate line on a substrate, wherein the substrate is a flexible substrate in which a bending area is included;
   a planarization layer which covers the driving element;
   an organic light emitting diode which is disposed on the planarization layer and is connected to the driving element;
   an electrostatic discharging circuit which is connected to the data line or the gate line; and
   a wiring electrode in the bending area,
   wherein the electrostatic discharging circuit is covered by a protective layer, and
   wherein the wiring electrode is the same material as an electrode selected from electrodes which configure the driving element.

2. The organic light emitting display device according to claim 1, wherein the planarization layer and the protective layer include at least one organic layer.

3. The organic light emitting display device according to claim 2, wherein the planarization layer in the driving element and the protective layer in the electrostatic discharging circuit are isolated from each other.

4. The organic light emitting display device according to claim 1, further comprising:
   an encapsulation layer which covers the organic light emitting diode and the protective layer,
   wherein in the bending area, the encapsulation layer is opened.

5. The organic light emitting display device according to claim 1, further comprising:
   a wiring electrode protecting layer which covers the wiring electrode.

6. The organic light emitting display device according to claim 5, wherein the wiring electrode protecting layer and the protective layer are isolated from each other.

7. The organic light emitting display device according to claim 6, wherein the wiring electrode protecting layer includes at least one organic layer.

8. The organic light emitting display device according to claim 1, wherein the wiring electrode is connected to the electrostatic discharging circuit.

9. A display device, comprising:
   an electrostatic discharging circuit is disposed on a substrate and connected to a driving element with a data line or a gate line, wherein the substrate is a flexible substrate in which a bending area is included;
   a planarization layer cover the driving element;
   a organic light emitting diode on the planarization layer;
   a wiring electrode disposed on the substrate in the bending area;
   a protective layer disposed on each of the organic light emitting diode and the electrostatic discharging circuit, and
   wherein the protective layers covering the electrostatic discharging circuit and the organic light emitting diode are isolated each other,
   wherein the wiring electrode protective layer and the protective layer on the electrostatic discharging circuit are isolated each other, and
   wherein the wiring electrode is the same material as an electrode selected from electrodes which configure the driving element.

10. The display apparatus according to claim 9, further comprising a encap layer on the protective layers disposed on the organic layer and the electrostatic discharge circuit and the wiring electrode protective layer disposed on the wiring electrode.

11. The display apparatus according to claim 9, wherein the wiring electrode protecting layer includes at least one organic layer.

12. The display apparatus according to claim 9, wherein the wiring electrode is connected to the electrostatic discharging circuit.

* * * * *